United States Patent [19]

Schneider et al.

[11] Patent Number: 5,297,721
[45] Date of Patent: Mar. 29, 1994

[54] NO-CLEAN SOLDERING FLUX AND METHOD USING THE SAME

[75] Inventors: Alvin F. Schneider, Edison, N.J.; David B. Blumel, New York, N.Y.; John V. Tomczak, Dolton, Ill.

[73] Assignee: Fry's Metals, Inc., Providence, R.I.

[21] Appl. No.: 976,931

[22] Filed: Nov. 19, 1992

[51] Int. Cl.$^5$ .................................. B23K 35/363
[52] U.S. Cl. ......................... 228/180.1; 228/223; 148/23; 148/25
[58] Field of Search ............ 228/207, 223, 261, 180.1, 228/37; 148/23, 24, 25

[56] References Cited

U.S. PATENT DOCUMENTS

| | | | |
|---|---|---|---|
| 3,746,620 | 7/1973 | Vance | 148/23 |
| 3,925,112 | 12/1975 | Petersen, Sr. et al. | 148/25 |
| 4,000,016 | 12/1976 | Lazzarini et al. | 148/23 |
| 4,077,815 | 3/1978 | Schuessler | 148/23 |
| 4,098,621 | 7/1978 | Strauss et al. | 148/23 |
| 4,113,524 | 9/1978 | Katz | 148/23 |
| 4,140,554 | 2/1979 | Stayner et al. | 148/23 |
| 4,151,015 | 4/1979 | Cooper | 148/23 |
| 4,568,395 | 2/1986 | Nabhani | 148/23 |
| 4,601,763 | 7/1986 | Stratil et al. | 148/23 |
| 4,661,173 | 4/1987 | Barajas | 148/24 |
| 4,708,751 | 11/1987 | Froebel et al. | 148/23 |
| 4,759,490 | 7/1988 | Ochiai | 228/124 |
| 4,895,606 | 1/1990 | Jafri | 148/25 |
| 4,940,498 | 7/1990 | Rubin | 148/23 |
| 4,988,395 | 1/1991 | Taguchi et al. | 148/24 |
| 4,994,119 | 2/1991 | Gutierrez et al. | 148/23 |
| 5,004,509 | 4/1991 | Bristol | 148/23 |
| 5,009,724 | 4/1991 | Dodd et al. | 148/23 |
| 5,069,730 | 12/1991 | Dodd et al. | 148/23 |
| 5,085,365 | 2/1992 | Turner | 228/223 |
| 5,131,962 | 7/1992 | Minahara et al. | 148/23 |
| 5,141,568 | 8/1992 | Turner et al. | 148/24 |
| 5,145,531 | 9/1992 | Turner et al. | 148/23 |

FOREIGN PATENT DOCUMENTS

| | | | |
|---|---|---|---|
| 49-26825 | 7/1974 | Japan | 148/25 |
| 49-26826 | 7/1974 | Japan | 148/25 |
| 62-6796 | 1/1987 | Japan . | |

Primary Examiner—Samuel M. Heinrich
Attorney, Agent, or Firm—Shapiro and Shapiro

[57] ABSTRACT

A no-clean soldering flux consists essentially of one or more halide-free, water soluble activators in an aggregate amount not exceeding about 5% by weight of the flux, a water soluble fluorinated surfactant in an amount not exceeding about 1% by weight of the flux, and water. The flux is substantially VOC-free and is particularly useful in a method of producing soldered printed wiring assemblies with minimal residual ionic contamination, so that post-soldering cleaning of the assemblies is unnecessary. The absence of significant amounts of VOC's and the elimination of post-soldering cleaning result in substantial environmental and production-related benefits.

22 Claims, No Drawings

NO-CLEAN SOLDERING FLUX AND METHOD USING THE SAME

BACKGROUND OF THE INVENTION

This invention pertains generally to soldering fluxes and methods, and is more particularly concerned with a water soluble soldering flux and a method using the same, which offer significant environmental benefits as well as significant production-related advantages, especially in the manufacture of critical, high reliability electronic assemblies such as printed wiring assemblies.

Printed wiring assemblies are commonly produced in a process known as wave soldering, in which surfaces of a printed wiring board (printed circuit board) and of component leads and terminations to be soldered thereto are subjected to a solder wave which passes along the board and components mounted thereon. The solder wave contacts the surfaces to be soldered, and bonds and electrically connects them together. Prior to the actual soldering of such assemblies, a flux is ordinarily applied to the surfaces to be joined in order to chemically prepare the surfaces to receive the solder, as by removing oxides, so that a good electrical and mechanical connection will be established. Typically, the flux is applied in somewhat loosely controlled amounts by so-called foam fluxing, in which the board and mounted components are passed along a foaming bed of flux which deposits on the surfaces to be soldered. The fluxed assembly is pre-heated prior to soldering to volatilize the flux carrier from the surfaces.

Soldering fluxes used by the electronics industry in the wave soldering of printed wiring assemblies have traditionally contained ingredients which are detrimental to the environment and/or which necessitate the use of post-soldering cleaning agents which themselves present undesirable environmental risk. For example, typical activated rosin fluxes utilize volatile organic compound (VOC) carriers, such as alcohols, which pollute the environment. Such fluxes may also leave substantial post-soldering contaminant residues of an ionic nature (traces of flux and its decomposition and reaction products) which can eventually corrode and otherwise physically and electrically degrade electronic assemblies, resulting in circuit failure. Thus, particularly in the case of critical, high reliability assemblies, the removal of such residues has been essential. Cleaning has perhaps most commonly been accomplished by vapor degreasing using chlorofluorocarbon (CFC) cleaning agents. The environmental hazards of CFC's, and particularly their recently understood harmful effects on the Earth's stratospheric ozone layer, have become a major worldwide concern.

As the environmental consequences of electronics production processes have become better understood, and in order to meet increasingly strict government regulations, the art has sought to avoid the above-described problems by developing alternative cleaning agents as well as by developing improved flux formulations which may be cleaned with safer, environmentally friendly cleaning agents, such as water.

For example, various water soluble fluxes have been proposed which may be cleaned by washing with water. While water cleaning is obviously preferable to CFC cleaning as a general proposition, prior water soluble fluxes have generally left much to be desired. For example, such fluxes have typically been formulated with substantial amounts of VOC solvents (commonly alcohols) and/or halide-containing activators. As noted earlier, VOC solvents are problematic from an environmental point of view. Halide-containing activators, on the other hand, are problematic in that they leave highly ionic, highly corrosive post-soldering residues which must be cleaned. More particularly, in the presence of humidity (water), the halides contained in such residues are known to act somewhat as catalysts in a regenerative corrosion reaction in which the halides complex with the metal (e.g., aluminum) of assembly components and are then regenerated by reaction of the halogenated complex with water, thereby becoming free to attack the metal again. Thus, so long as the humidity remains present (and humidity is, of course, almost always present in practice), the corrosion reaction may proceed unremittingly, ultimately resulting in circuit failure.

SUMMARY OF THE INVENTION

In accordance with one of its principal aspects, the present invention provides a soldering flux which is water soluble (indeed being in the form of aqueous solution), substantially VOC-free, halide-free and, more generally, non-corrosive. The flux of the invention is particularly formulated so as to provide highly effective and thorough fluxing of printed wiring assemblies to be wave soldered and, quite importantly, to achieve both minimal residual ionic contamination and high surface insulation resistance, so that post-soldering cleaning is unnecessary. The unique no-clean flux of the present invention thus avoids the environmental problems associated with VOC's, as well as problems and costs associated with post-soldering cleaning processes—including even water washing. In its most preferred form, the no-clean flux of the present invention is also particularly advantageous for purposes of transport and storage, in that repeated freezing and thawing does not adversely affect the essential properties of the formulation.

More succinctly stated, the present invention provides a no-clean soldering flux substantially free of VOC's and consisting essentially of one or more halide-free, water soluble activators in an aggregate amount not exceeding about 5% by weight of the flux, a water soluble fluorinated surfactant in an amount not exceeding about 1% by weight of the flux, and water. Preferably, each activator of the flux is sufficiently soluble in water to remain fully in solution after freezing and thawing of the flux.

In accordance with a second of its principal aspects, the invention provides a method of producing soldered printed wiring assemblies with minimal residual ionic contamination, comprising spray fluxing the assemblies with the above-described soldering flux, pre-heating the fluxed assemblies to volatilize the water from the flux, and wave soldering the assemblies.

By the foregoing method, and particularly by the use of the uniquely advantageous no-clean flux of the present invention without post-soldering cleaning, residual ionic contamination levels may be achieved which are below even the stringent requirements of military specifications applicable to printed wiring assemblies that have been subjected to post-soldering cleaning.

Wave soldering in the present invention may be carried out, for example, in an air atmosphere or in a substantially inerted atmosphere such as nitrogen with controlled levels of oxygen content.

DETAILED DESCRIPTION OF THE INVENTION

The flux according to the present invention contains three principal ingredients, namely: halide-free, water soluble activator (one or more), a water soluble fluorinated surfactant, and water—preferably deionized. The flux of the invention is easily prepared by the addition of appropriate proportions of the activator(s) and surfactant to the water at room temperature, and mixing to form an aqueous solution. It is, of course, also compatible with solders normally used in the wave soldering of printed wiring assemblies and with the metals normally being soldered in such processes. The solders are most commonly binary tin/lead systems containing around 60% tin and 40% lead by weight, 63%-tin/37%-lead being typical. Additional constituents such as silver and antimony may also be present, 62%-tin/36%-lead/2%-silver being exemplary of such compositions. Lead-free solder systems such as the tin/bismuth system, of which 42%-tin/58%-bismuth is an example, are also known. The metals being soldered commonly include copper, tin-lead coated copper, and copper alloys (e.g., bronzes and brasses). Other metals that may be present include nickel, iron-nickel alloys, and Kovar (iron-nickel-cobalt alloy)—possibly coated with gold, silver, palladium, or tin-lead alloy.

For purposes of fluxing printed wiring assemblies, the flux of the invention is preferably applied by spraying. In contrast to the foam fluxing technique traditionally used in wave soldering processes, spray fluxing in accordance with the present invention allows the quantity of applied flux to be closely controlled so that the flux may be applied to the surfaces to be soldered in an amount sufficient to produce good solder joints, while also minimizing the quantity of flux residue which will be left on the assembly after soldering. Excessive quantities of flux residue are undesirable since they may lead to degradation of surface insulation resistance and electrical failure of the assembly, especially under conditions of high temperature and humidity.

The spray application rate is preferably chosen such that the amount of flux "solids" (more precisely, nonvolatiles) remaining on the printed wiring assembly after drying (after the water has been volatilized) is in the range of from about 200 micrograms to about 1,500 micrograms per square inch (from about 31 micrograms to about 233 micrograms per square centimeter) of board area, and more preferably in the range from about 400 micrograms to about 1,200 micrograms per square inch (from about 62 micrograms to about 186 micrograms per square centimeter) of board area. This will assure sufficient wetting by the flux of the surfaces to be wave soldered and good solder joints, as well as assuring minimal residual ionic contamination and good (high) surface insulation resistance of the soldered assembly—with no post-soldering cleaning.

1. Activators

The flux of the present invention will contain one or more halide-free, water soluble activators. Although not required within the broader scope of the invention, it has been found highly advantageous and therefore preferable to select activators which exhibit sufficient solubility in water to remain fully in solution after one or more freezing/thawing cycles of the flux. More particularly, should the flux be frozen during transportation or storage, the use of such activators ensures that the flux will be in solution form after thawing, whereby it is still effective for use. Generally speaking, solubility in water of at least about 5 grams per 100 cc at 20° C. (68° F.) will be sufficient for this purpose. Activators of low solubility do not offer the foregoing advantage, because they drop out and remain out of solution when the flux is subjected to a freeze/thaw cycle, whereby the flux cannot be used without further processing (such as by heating the flux sufficiently above room temperature to restore the solution).

The total activator content of the flux should be between about 0.2 and about 5.0% by weight of the flux. Lower activator content will not provide sufficient fluxing activity, while a higher activator content will result in excessive residues which could adversely effect the finished soldered assembly, which is not intended to be cleaned. Of course, as between stronger and weaker activators, stronger activators should be used in amounts more toward the lower end of the indicated range. The preferred activator content is from 0.5 to 3.0% by weight of the flux.

Examples of halide-free activators suitable for use in the present invention include organic activators such as carboxylic acids, sulfonic acids, phosphonic acids, phosphate esters, amino acids, alkanolamines, and combinations thereof. Such activators are only weakly ionic relative to halide-containing activators, such as amine hydrohalides (e.g., amine hydrochlorides and amine hydrobromides), commonly used in the electronics industry. Moreover, being halide-free, they do not lead to the earlier-described regenerative corrosion reaction which takes place when halides are present.

For purposes of the present invention, carboxylic acid activators have been found to provide an excellent combination of soldering performance, minimal residual ionic contamination, and high surface insulation resistance. Amongst the carboxylic acid class, glutaric acid and succinic acid have been found to be especially suitable activators for the practice of the present invention, both alone and in combination.

The following are examples of carboxylic acids and other activators suitable for use in the present invention, all having solubility in water of at least 5 grams per 100 cc at 20° C. (68° F.):

Monocarboxylic Acids

Formic Acid
Acetic Acid
Propionic Acid
Butyric Acid

Dicarboxylic Acids

Oxalic Acid
Malonic Acid
Succinic Acid
Glutaric Acid
Maleic Acid
Itaconic Acid

Tricarboxylic Acids

Aconitic Acid

Hydroxycarboxylic Acids

Glycolic Acid
Lactic Acid
Mandelic Acid
Malic Acid
Tartaric Acid
Citric Acid

Diglycolic Acid

Ketocarboxylic Acids

Levulinic Acid

Sulfonic Acids

Benzenesulfonic Acid
Toluenesulfonic Acid

Phosphonic Acids

Phosphonoacetic Acid
1-Hydroxyethylidene-1,1-Diphosphonic Acid
Phenyl Phosphonic Acid

Phosphate Esters

Monophosphate esters and Diphosphate Esters based on Aliphatic Alcohols, Aliphatic Ethoxylated Alcohols, Aromatic Alcohols or Aromatic Ethoxylated Alcohols

Amino Acids

Glycine
Aminobutyric Acid
Aminovaleric Acid

Alkanolamines

Triisopropanolamine
Triethanolamine

2. Surfactant

A fluorinated surfactant is an important constituent of the flux of the present invention. Fluorinated surfactants as a class are powerful surface active agents, effective at very low concentrations. In practice of the invention, the surfactant should be present in a concentration less than about 1.0% by weight of the flux, preferably in a concentration of not more than about 0.1%. This enables the flux to thoroughly wet the surfaces to be soldered, while not contributing substantially to the level of flux residues which will be left behind after soldering.

Zonyl FSN Fluorosurfactant (described as a perfluoroalkyl ethoxylate) available from E. I. DuPont de Nemours & Co., Inc. has been found to be especially suitable for the present invention. Fluorinated surfactants from other manufacturers may also be used, such as Fluorad FC-430 (described as a fluoroaliphatic polymeric ester) available from the Industrial Chemical Products Division of 3M, and ATSURF fluorosurfactants available from Imperial Chemical Industries.

3. Other Ingredients

The flux of the invention may contain various additional ingredients in minor amounts which do not materially affect its basic properties. Such ingredients include, for example, corrosion inhibitors such as benzotriazole, substituted benzotriazoles (e.g., hydroxybenzotriazole), imidazoles, and substituted imidazoles; stabilizers; and fungicides. They may be added in an aggregate amount preferably not exceeding about 0.1% by weight of the flux. The use of such ingredients is well understood by those skilled in the art.

Also, certain ingredients may be supplied by the manufacturer in an organic solvent carrier such as isopropanol. For example, the DuPont Zonyl FSN fluorosurfactant used in a number of the specific examples appearing hereinafter is supplied as a 40% concentration of active (surfactant) in 30% each of water and isopropyl alcohol. Given the small concentration of this ingredient actually used in the flux of the invention, however, the amount of isopropyl alcohol present in the flux will be negligible. As an example, at 0.09% Zonyl FSN by weight of the flux, the resulting isopropyl alcohol content will be only 0.027% by weight of the flux. Needless to say, the presence of such insignificant incidental amounts of alcohol does not alter the essentially VOC-free nature of the flux.

SPECIFIC EXAMPLES

The following are specific examples of compositions formulated in accordance with the present invention. In each example, the flux was prepared by dissolving the activator(s) and surfactant in deionized (DI) water at room temperature to yield a homogeneous aqueous solution. All of the ingredients listed in the examples are readily available commercially and were used without modification. The acid activators of Examples 1-8 and the triisopropanolamine of Example 5 were in commercially pure form (substantially 100% purity). Maphos L-10 used in Example 5 is an aliphatic phosphate ester available from Mazer Chemical Inc.

| | % by Weight |
|---|---|
| Example 1 | |
| DI Water | 98.91 |
| Glutaric acid | 0.50 |
| Succinic acid | 0.50 |
| Zonyl FSN | 0.09 |
| | 100.00% |
| Example 2 | |
| DI water | 97.91 |
| Glutaric acid | 1.0 |
| Succinic acid | 1.0 |
| Zonyl FSN | 0.09 |
| | 100.00% |
| Example 3 | |
| DI water | 97.91 |
| Succinic acid | 2.0 |
| Zonyl FSN | 0.09 |
| | 100.00% |
| Examle 4 | |
| DI water | 97.85 |
| Itaconic acid | 2.0 |
| Fluorad FC-430 | 0.05 |
| Benzotriazole | 0.10 |
| | 100.00% |
| Example 5 | |
| DI water | 97.91 |
| Succinic acid | 1.0 |
| Maphos L-10 | 0.8 |
| Triisopropanolamine | 0.2 |
| Zonyl FSN | 0.09 |
| | 100.00% |
| Example 6 | |
| DI water | 97.95 |
| Succinic acid | 1.8 |
| P-Toluenesulfonic Acid | 0.2 |
| Fluorad FC-430 | 0.05 |
| | 100.00% |
| Example 7 | |
| DI water | 97.91 |
| Succinic acid | 1.0 |
| Glycine | 1.0 |
| Zonyl FSN | 0.09 |
| | 100.00% |
| Example 8 | |
| DI Water | 97.91 |
| Succinic acid | 1.9 |
| Phosphonoacetic Acid | 0.1 |
| Zonyl FSN | 0.09 |
| | 100.00% |

Of the above Examples, the fluxes of Examples 1 through 4 are more preferred, in that they contain only carboxylic acid activators. These four compositions were subjected to freeze/thaw testing as follows. A sample of each flux was added to a glass bottle, capped and placed in a freezer at −15° C. (5° F.) for 24 hours. The bottles were then removed from the freezer and the frozen fluxes were allowed to thaw and warm to room temperature. None of the fluxes had any separation or precipitation at room temperature (20°-25° C.; 68°-77° F.) at the completion of testing. This means that if the fluxes are transported or stored at freezing temperatures, when brought inside and allowed to warm to ambient temperature, the fluxes will be in complete homogeneous solution making them suitable for use.

The above test was repeated in a refrigerator at 5° C. (41° F.). There was no evidence of precipitation with any of the samples.

Wave soldering tests were conducted with the fluxes in Examples 1 and 2. The test boards were of the double-sided, solder mask over bare copper, hot-air leveled, plated through hole type. The boards were spray fluxed and wave soldered (63%tin/37%-lead solder) on an Electrovert Econopak II machine. The pre-heater surface temperature was set at 537° C. (999° F.) and the conveyor speed at 1.07 meters/min. (3.5 ft./min.). These settings enabled all of the water from the fluxes to evaporate prior to the board reaching the solder wave. The solder pot temperature was 260° C. (500° F.).

After soldering, the boards were examined for quality of solder wetting, which was found to be excellent. There was no observable solder non-wetting, dewetting, bridging, or icicling. Smooth, shiny solder fillets were formed with complete hole filling. Traces of flux residues were barely visible and uniformly distributed over the board surface.

Some of the boards soldered with fluxes in Examples 1 and 2 were measured for levels of ionic contamination with an Omegameter 600SMD ionic contamination measurement system manufactured by Alpha Metals, Inc. of Jersey City, N.J. The results were all within the 14 microgram per square inch maximum level allowable per Military Specification Mil-P-28809. This demonstrated that the fluxes leave very low levels of residual ionic contamination.

Boards soldered with the fluxes of Examples 1 and 2 were also tested for surface insulation resistance per IPC-SF-818 Standard, Assembly Class 3 test conditions. The test results for each flux exceeded the 7 day minimum requirement of $1.0 \times 10^8$ ohms at 85° C./85% R.H., confirming that the flux residues (i.e., residues of the flux and its reaction and decomposition products) are essentially non-corrosive at the levels present. At the conclusion of testing, the boards were examined and no visible corrosion was evident.

While the present invention has been described hereinabove with respect to its preferred implementation, it will be apparent to those skilled in the art that various changes and modifications may be made in keeping with the principles and spirit of the invention, the scope of which is defined in the appended claims.

We claim as our invention:

1. A no-clean soldering flux which is substantially VOC-free and which consists essentially of one or more halide-free, water soluble activators in an aggregate amount not exceeding about 5% by weight of the flux, a water soluble fluorinated surfactant in an amount not exceeding about 1% by weight of the flux, and water.

2. A soldering flux according to claim 1, wherein each said activator is sufficiently soluble in water to remain fully in solution after freezing and thawing of the flux.

3. A soldering flux according to claim 2, wherein each said activator has a solubility in water of at least 5 grams per 100 cc at 20° C.

4. A soldering flux according to claim 3, wherein each said activator is selected from the group consisting of carboxylic acids, sulfonic acids, phosphonic acids, phosphate esters, amino acids, alkanolamines, and combinations thereof.

5. A soldering flux according to claim 3, wherein each said activator is a carboxylic acid.

6. A soldering flux according to claim 3 and containing only one said activator, namely, glutaric acid.

7. A soldering flux according to claim 3 and containing only one said activator, namely, succinic acid.

8. A soldering flux according to claim 3 and containing only two said activators, namely, glutaric acid and succinic acid.

9. A soldering flux according to claim 1, wherein the aggregate amount of activator is from 0.5% to 3.0% by weight of the flux.

10. A soldering flux according to claim 9, wherein the amount of fluorinated surfactant is not more than about 0.1% by weight of the flux.

11. A method of producing soldered printed wiring assemblies with minimal residual ionic contamination, comprising:
   spray fluxing the assemblies with a no-clean soldering flux which is substantially VOC-free and which consists essentially of one or more halide-free, water soluble activators in an aggregate amount not exceeding about 5% by weight of the flux, a water soluble fluorinated surfactant in an amount not exceeding about 1% by weight of the flux, and water;
   pre-heating the fluxed assemblies to volatilize the water from the flux; and
   wave soldering the assemblies.

12. A method according to claim 11, wherein each said activator of the flux is characterized by sufficient solubility in water to remain fully in solution after freezing and thawing of the flux.

13. A method according to claim 12, wherein each said activator of the flux has a solubility in water of at least 5 grams per 100 cc at 20° C.

14. A method according to claim 13, wherein each said activator is selected from the group consisting of carboxylic acids, sulfonic acids, phosphonic acids, phosphate esters, amino acids, alkanolamines, and combinations thereof.

15. A method according to claim 13, wherein each said activator of the flux is a carboxylic acid.

16. A method according to claim 13, wherein the flux contains only a single activator, namely, glutaric acid.

17. A method according to claim 13, wherein the flux contains only a single activator, namely, succinic acid.

18. A method according to claim 13, wherein the flux contains only two activators, namely, glutaric acid and succinic acid.

19. A method according to claim 11, wherein the flux is sprayed at an application rate such that the amount of flux solids remaining on the assemblies after the water is volatilized is in the range from about 200 micrograms to about 1,500 micrograms per square inch (from about 31 micrograms to about 233 micrograms per square centimeter) of board area of the assemblies.

20. A method according to claim 19, wherein the application rate is such that said amount is in the range from about 400 micrograms to about 1,200 micrograms per square inch (from about 62 micrograms to about 186 micrograms per square centimeter) of board area of the assemblies.

21. A method according to claim 11, wherein the aggregate amount of activator is from 0.5% to 3.0% by weight of the flux.

22. A method according to claim 21, wherein the amount of fluorinated surfactant is not more than about 0.1% by weight of the flux.

* * * * *